United States Patent [19]

Tihanyi et al.

[11] Patent Number: 4,563,368
[45] Date of Patent: Jan. 7, 1986

[54] PASSIVATION FOR SURFACES AND INTERFACES OF SEMICONDUCTOR LASER FACETS OR THE LIKE

[75] Inventors: Peter Tihanyi, Palo Alto; Robert S. Bauer, Portola, both of Calif.

[73] Assignee: Xerox Corporation, Stamford, Conn.

[21] Appl. No.: 647,292

[22] Filed: Sep. 4, 1984

Related U.S. Application Data

[62] Division of Ser. No. 466,763, Feb. 14, 1983, abandoned.

[51] Int. Cl.$^4$ ................................................ H01S 3/19
[52] U.S. Cl. ........................................ 427/82; 427/87; 427/88; 29/569 L; 372/49; 148/DIG. 60
[58] Field of Search ...................... 427/87, 88, 82, 399; 29/569 L; 148/DIG. 60; 372/49

[56] References Cited

U.S. PATENT DOCUMENTS 4,178,564 12/1979 Ladany et al. .
4,337,443 6/1980 Umeda et al. ........................ 372/49

OTHER PUBLICATIONS

F. R. Nash et al., "GaAs Laser Reliability and Protective Facet Coatings", Journal of Applied Physics, 50(5), pp. 3122-3132 (May, 1979).
John A. F. Peek, "Water Vapor, Facet Erosion, and the Degradation of (Al,Ga)As DH Lasers Operated at CW Output Powers of Up to e mW/$\mu$ Stripewidth" IEEE Journal of Quantum Electronics, vol. QE-17, No. 5, pp. 781-786 (May 1981).
Mizuishi et al., "The Effect of Sputtered-SiO$_2$ Facet Coating Films on the Suppression of Self Sustained Pulsations in the Output of (GaAl)As Double Heterostructure Lasers During CW Operation", IEEE Journal of Quantum Electronics, QE-16(7), pp. 728-734 (Jul., 1980).
S. K. Ghandhi et al., "Ion Beam Damage Effects During the Low Energy Cleaning of GaAs", IEEE Electron Device Letters, vol. EDL-3(2), pp. 48-50 (Feb. 1982).
M. Kawabe et al., "Effects of Ion Etching on the Properties of GaAs", Applied Optics, vol. 7(16), pp. 2556-2561 (Aug. 15, 1978).
R. S. Bauer et al., "Au and Al Interface Reactions with SiO$_2$", Applied Physics Letters, vol. 37(11), pp. 1006-1008 (Dec. 1, 1980).
S. T. Kowalczyk et al., "Interfacial Chemical Reactivity of Metal Contacts with Thin Native Oxides of GaAs", Journal of Vaccum Science Technology, vol. 19(3), pp. 611-616 (Sep./Oct. 1981).
G. P. Schwartz et al., "Chemical Reaction at the Al--GaAs Interface", Journal of Vaccum Science Technology, vol 19(3), pp. 607-610 (Sep./Oct. 1981).
"Dielectric Films on Gallium Arsenide" by W. F. Croydon and E. H. C. Parker and Published in 1981 by Gordon & Beach, Science Publishers, Inc., Section 5.4.4 Oxidation of Deposited Metal Films (page 101).
T. Yuasa et al., "Degradation of (AlGa)As DH Lasers Due to Facet Oxidation," Applied Physics Letters, 32(2), pp. 119-121 (Jan. 15, 1978).
C. H. Henry et al., "Catastrophic Damage of AlGaAs Double-Heterostructure Laser Material", Journal of Applied Physics, 50, p. 3721 (1979).
F. R. Nash et al., "Facet Oxide Formation and Degradation of GaAs Lasers", Journal of Applied Physics, 50(5), pp. 3133-3441 (May, 1979).

Primary Examiner—John D. Smith
Attorney, Agent, or Firm—W. Douglas Carothers, Jr.

[57] ABSTRACT

A method of making a facet coating for a semiconductor light emitting device, such as a semiconductor laser or the like, comprising the steps of depositing a thin layer of a reactive material on the cleaved facet to getter oxygen and other reactive contaminants therefrom, and controlling the thickness of the deposition to be sufficiently thick to react with an optimum amount of said contaminants but sufficiently thin in order that the reactive material is sufficiently consumed in the gettering process to render the thin layer electrically nonconductive if conductive in nature. The reactive material may be selected from the group consisting of Al, Si, Ta, V, Sb, Mn, Cr and Ti. Al has been found to be particularly good as a passivating layer with a preferred thickness for the layer being in the range of about 20 Å to 75 Å, depending upon whether the layer is for purposes of surface passivation or interface passivation.

3 Claims, 5 Drawing Figures

PASSIVATION FOR SURFACES AND INTERFACES OF SEMICONDUCTOR LASER FACETS OR THE LIKE

This is a division, of application Ser. No. 466,763, filed Feb. 14, 1983 abondoned.

BACKGROUND OF THE INVENTION

This invention relates generally to the facet passivation of semiconductor light emitting devices by the reactive reduction of contaminants thereon and more particularly to a passivating layer deposited on the cleaved facet of semiconductor lasers, LED's or the like and the method of deposition thereof.

Facet damage due to mirror oxidation when, for example, a cleaved facet of a semiconductor laser is exposed to the atmosphere is a major mechanism of gradual and catastropic mirror degradation. See, for example, the Article of T. Yuasia et al, "Degradation of (AlGa)As DH Lasers Due to Facet Oxidation," *Applied physics Letters*, 32(2), pp. 119-121 (Jan. 15, 1978); C. H. Henry et al, "Catastrophic Damage of AlGaAs Double-Heterostructure Laser Material", *Journal of Applied Physics*, 50, p. 3721 (1979); F. R. Nash et al, "Facet Oxide Formation and Degradation of GaAs Lasers", *Journal of Applied Physics*, 59(5) pp. 3133-3441; F. R. Nash et al, "GaAs Laser Reliability and Protective Facet Coatings", *Journal of Applied Physics*, 50(5) pp. 3122-3132 (May, 1979); and John A. F. Peek, "Water Vapor, Facet Erosion, and the Degradation of (Al,-Ga)As DH Lasers Operated at CW Output Powers of Up to 3 mW/$\mu$ Stripewidth", *IEEE Journal of Quantum Electronics*, Vol. QE-17, No. 5, pp. 781-786 (May 1981). Also, see U.S. Pat. Nos. 4,178,564 and 4,337,443. From these references, it has been known that atmospheric exposure of laser facets form a passivation film or coating of transparent insulative materials, such as $SiO_2$, $Al_2O_3$, MgO, ZnO, $TiO_2$, $Si_3N_4$, etc., on the exposed facets of a semiconductor laser. The purpose of the facet coating is to protect the laser from the ambient atmosphere, oxidation and resulting facet erosion upon operational use of the laser. The coating reduces threshold current, increases external differential quantum efficiency, and increases the catastrophic degradation. Without some type of protection, catastrophic degradation may occur after a period of use, requiring laser replacement.

While the coating on the laser facet protects it from the ambient, facet degradation still occurs due to the presence of at least some contaminants on the facet on the original surface at the interface with the protective overcoating in spite of careful cleaning of the facet surface prior to passivation coating.

Recently, it has been suggested that facet erosion may be suppressed by employing ion milling techniques on the facet surface prior to mirror coating. See the Article of Mizuishi et al, "The Effect of Sputtered - $SiO_2$ Facet Coating Films on the Suppression of Self-Sustained Pulsations in the Output of (GaAl)As Double Heterostructure Lasers During CW Operation", *IEEE Journal of Quantum Electronics*, QE-16(7), pp. 728-734 (July, 1980). This technique involves ion milling the laser facet surface to a predetermined depth to remove facet contamination followed by the deposition of a protective coating to increase the laser lifetime.

However, it has been observed that ion beam damage resulting to the laser facet can be significant, particularly if the depth of surface damage is sufficiently large as a few hundred angstroms. See, for example, the discussion in the Articles of S. K. Ghandhi et al, "Ion Beam Damage Effects During the Low Energy Cleaning of GaAs", *IEEE Electron Device Letters*, Vol. EDL-3(2), pp, 48-50 (February 1982) and M. Kawabe et al, "Effects of Ion Etching on the Properties of GaAs", *Applied Optics*, Vol. 7(16), pp. 2556-2561 (Aug. 15, 1978).

The primary objective of this invention is to overcome the above-mentioned difficulties in providing more durable passivation coatings on semiconductor light emitting devices, such as lasers, LEDs or the like, without the requirement of ion milling techniques. It covers such devices both with and without subsquent overcoating, both reflective and antireflective.

SUMMARY OF THE INVENTION

According to this invention, a passivation coating or layer comprising a reactive thin film is deposited on the air-cleaved facet of a semiconductor light emitting device, e.g. a semiconductor diode laser or the like, to getter oxygen, $H_2O$ and other reactive contaminants present on the facet surface. In this context, the coating or layer functions as a gettering layer.

The thin passivating layer is normally a highly reactive material, e.g., Al. It is deposited on the cleaved facet to remove contaminants from the facet by reactive outdiffusion into this overlayer. The layer thickness must be controlled to be sufficiently thick to react with an optimum amount of contaminants but sufficiently thin in order that the reactive material is substantially consumed in the gettering process to render the thin layer, electrically conductive in nature, electrically nonconductive and not create an electrical discharge or short circuit condition across the junction of the semiconductor device.

The deposited film or layer is very thin. For example, for Al, we found that the layer thickness need not exceed 75 Å and is preferably below 50 Å. Al is particuarly a good choice for Group III-V compounds, such as GaAs/GaAlAs injection diode lasers. Al is so electropositive that it will readily react with almost any intermediate compounds which might be formed on the (GaAl)As facet surface forming dielectric "modules" and compounds, e.g., $Al_2O_3$. When used as the only coating for the laser facet, surface oxidation of the passivation layer itself will allow this getter layer to be as thick as ~75 Å without degradation of its beneficial effect.

The choice of material depends on the relative stability of the facet contaminant compounds compared to the possible reaction products of the contamination species with the gettering overlayer. Thus, for the exemplary Al passivating gettering layer, the heat of formation for $Al_2O_3$ ($-395$ Kcal/mole) is greater than either $Ga_2O_3$ ($-260$ Kcal/mole) or $As_4O_6$ ($-314$ Kcal/mole). From such considerations, other chemically reactive films that are within the scope of this invention are Si (either deposited in a hydrogen environment or deposited as a silane compound), Ta, V, Sb, Mn, Cr and Ti. Other possible materials may be Fe, Re, Zr and Tc.

The gettering layer is what we describe as a "surface passivation" of the semiconductor facet. Without the addition of any subsequent mirror or antirefective overcoatings, diode laser performance is improved substantially over conventionally processed diode lasers having mirror overcoatings but not provided with a previous surface passivation.

The gettering layer can also be deposited at the "interface" between the cleaved mirror facet and subsequent reflective or anti-reflective overcoatings. In this case, a final dielectric mirror coating or layer such as $Al_2O_3$ or $SiO_2$, is deposited on the previously deposited thin passivating layer to a thickness for proper wavelength matching conditions known in the art. Alternatively, a dielectric mirror stack may be deposited on the passivating layer. Because the reactive passivation layer becomes electrically nonconductive in nature during the gettering process, a final reflective coating on the back facet of the diode laser may be electrically conductive but not capable of short circuiting the p-n junction of the device.

Other objects and attainments together with a fuller understanding of the invention will become apparent and appreciated by referring to the following description and claims taken in conjunction with the accompanying drawings.

DETAILED DESCRIPTION OF THE INVENTION

Figure 1:
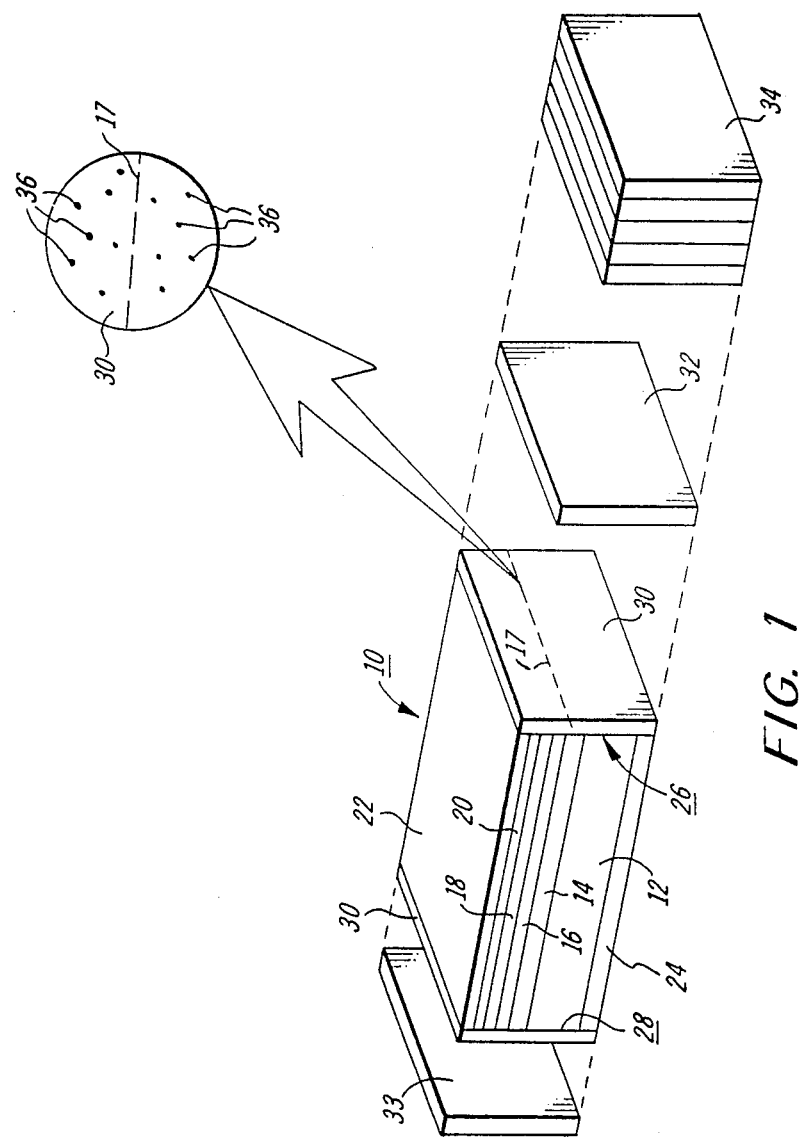
FIG. 1 is a perspective view illustrating a semiconductor laser with a passivating layer according to this invention.

Referring to FIG. 1, there is shown a semiconductor laser 10 comprising a plurality of epitaxially deposited layers comprising Group III-V elements as known in the art. For example, laser 10 may be a double heterostructure of the GaAs/GaAlAs regime comprising substrate 12 of n-GaAs; a cladding layer 14 of n-$Ga_{1-x}Al_xAs$, an active layer 16 of doped or undoped GaAs or $Ga_{1-y}Al_yAs$ forming a p-n junction 17; a cladding layer 18 of p-$Ga_{1-z}Al_zAs$ and a contact layer 20 of p-GaAs where x, z>y. Laser 10 also is provided with conventional metal contacts 22 and 24.

Other III-V regimes may be involved, such as those containing crystalline materials of two or more of In, Ga, Al, P, Sb, Sn and Te.

As illustrated in FIG. 1, a thin passivation layer 30 is deposited on the laser mirror facets 26 and 28 of laser 10. Layer 20 may be deposited on the light emitting surfaces of other semiconductor light emitting devices, such as LEDs, requiring surface contamination removal. Layer 30 is relatively a very thin reactive coating deposited on laser facets 26 and 28 to getter reactive contaminants present on the air-cleaved laser facets. An example of a reactive material for layer 30 is Al. An Al layer 30 may be deposited by the sputtering of Al. Sputtering apparatus of a conventional diode type may be employed using a high purity (99.999%) Al target. The laser 10 is mounted with a facet oriented toward the target. The side portions of the laser are covered so as not to be exposed to the sputtered Al.

The vacuum chamber of the sputtering apparatus is filled with argon at a pressure of about $6 \times 10^{-5}$ Torr. After about 8 to 20 seconds from the initiation of Al target sputtering, an Al layer 30 can be formed on the laser facet having a thickness of about 20 Å to 75 Å.

From an examination of a deposited layer 30 of Al using auger electron spectroscopy, we have discovered that the pure Al of layer 30 reacted with contaminants on the facet, particuarly oxygen and oxygen entrained contaminants, to produce $AlO_x$ compounds, e.g., $Al_2O_3$.

In the context of this invention, the deposited layer 30 may be applied for the purposes of "surface passivation" or "interface passivation". In the case of surface passivation, layer 30 functions to protect the facet from the ambient, i.e., a final terminating coating. In such instances, the thickness of the layer generally need not exceed, for example, 75 Å. In the case of interface passivation, layer 30 provides the primary function of a coupling medium to an overcoating to optimize the optical properties of the laser as well as protect the facet from the ambient. In such instances, the thickness of the layer generally need not exceed, for example, 50 Å. Examples of overcoatings are a protective or anti-reflecting layer 32, a highly reflective mirror layer 33 and a dielectric mirror stack 34.

After deposition of layer 30, an outer protective coating or layer 32 of $Al_2O_3$ may be deposited on layer 30 using the same apparatus and Al target. Oxygen gas (15%) is introduced into the vacuum chamber mixed with the Ar gas. An $Al_2O_3$ layer 32 is then deposited using standard reactive sputtering techniques. Layer 32 may be, for example, 2000 Å to 2500 Å thick.

Alternatively, a dielectric mirror stack 34 may be formed on layer 30 using standard sputtering or vapor deposition techniques. Stack 34 may, for example, consist of contiguous alternating layers of Si and $Al_2O_3$ or $SiO_2$. An example of such a dielectric stack is disclosed in U.S. Pat. No. 4,092,659.

Because of the nonconductive nature of the deposited passivation layer 30, the deposit of pure metal coatings, such as layer 33, directly onto layer 30 function as a high reflective mirror without concern for electrical shorting of the device junction.

In the course of auger chemical investigation, we discovered that the reactive layer 30 reduces the oxygen at the laser facet by at least a factor of five (5) compared to air-exposed, as-cleaved laser facets. There is also some evidence that carbon concentrates within the reacted Al layer 30 had been also removed from the facet. Within the sensitivity of the auger electron spectroscopy, the contaminant gettering is as effective at cleaning the facet as $Ar^+$ ion-beam milling techniques currently being employed for facet cleaning of state-of-the-art semiconductor lasers. The advantage of the reactive outdiffusion technique comprising this invention is that it avoids facet damage, such as the production of (GaAl)As surface nonstoichiometry, which is inherent in the sputter-etching facet cleaning techniques. It is, therefore, believed that employing a thin layer 30 will substantially eliminate one of the major causes of catastrophic laser degradation, namely nonradiative recombination at facet-related defects present in these laser facets.

An important aspect of this invention is the manner of choosing the layer thickness for layer 30, e.g., Al for interface passivation. It must be thick enough to react with as much oxygen and other contaminants as possible. On the other hand, it must be thin enough so that most of the continuous film metallic Al is consumed in the oxidation or gettering process. This consumption yields an $AlO_x$, principally $Al_2O_3$, interlayer which is electrically non-conducting.

The peak concentration of reacted Al occurs 25 Å±7 Å from the facet surface. Consistent with this result, testing of predeposited Al layers 30 on diode lasers 10 has led to an empirically determined lower limit of about 20 Å for the minimum Al coating thickness of layer 30, which would yield satisfactory operating devices.

The upper limit for Al layer thickness is determined by the conductivity of the final film after reactive outdiffusion with the facet contaminants. Determined from auger analysis, this is at about the same distance from the (GaAl)As as the oxidized Al layer 30 so that there is a relative peak in the concentration of unreacted metallic Al remaining in the film. This corresponds to a concentration of Al metal some 10 atoms away from the facet interface. Because no unreacted Al appears at the facet above at most 0.1% concentration, the conclusion may be reached that the Al layer may be twice the dimension of the peak oxide concentration and still not exhibit significant electrical conduction. Based on such auger measurements, the maximum thickness of the Al layer 30 may be about 50 Å.

Consistent with the foregoing, testing of predeposited Al layers on diode lasers, with complete anti-reflection coatings 34, has led to an empirically determined upper limit of 50 Å for the greatest Al coating thickness which would yield devices that were not short circuited by the deposition of reactive layer 30. Because the auger measurements showed metallic Al concentrations in thick films, we theorize that the Al which is not oxidized in films of thickness greater than 25 Å are probably in metallic clusters 36 within the final contaminant reacted layer 30, which is pictorially illustrated in FIG. 1. Above about 50 Å Al layer thicknesses, these clusters 36 become large enough to "touch" and provide short circuit properties across the laser junction 17.

Should anti-reflection front layers 34 or reflective back layers 33 not be used as overcoatings on the reactive passivation layer 30, i.e., layer 30 is to be deposited for the purpose of surface passivation, then the thickness of layer 30 may be increased by an amount equivalent to reactive gettering by contamination due to exposure to air. In the case of Al, this surface oxidation process under normal ambient conditions would consume about 25 Å of a deposited layer resulting in a net maximum thickness of 75 Å, for example, for the surface passivation layer.

The invention is now described in conjunction with some examples for the purpose of exemplification of the claimed invention without intending to place ridged boundaries on its parameters or utility.

Several samples of both air cleaved <110> facets of single crystal GaAs and GaAs/GaAlAs double heterostructure lasers were employed. These samples were cleaved in air approximately one hour before insertion into the vacuum chamber of the previously described sputtering apparatus. On some of these samples, a thin film of Al of about 50 Å thick was then deposited on the cleaved surfaces and facets by standard Ar+ deposition techniques using a 99.999% pure Al target.

Figure 2:
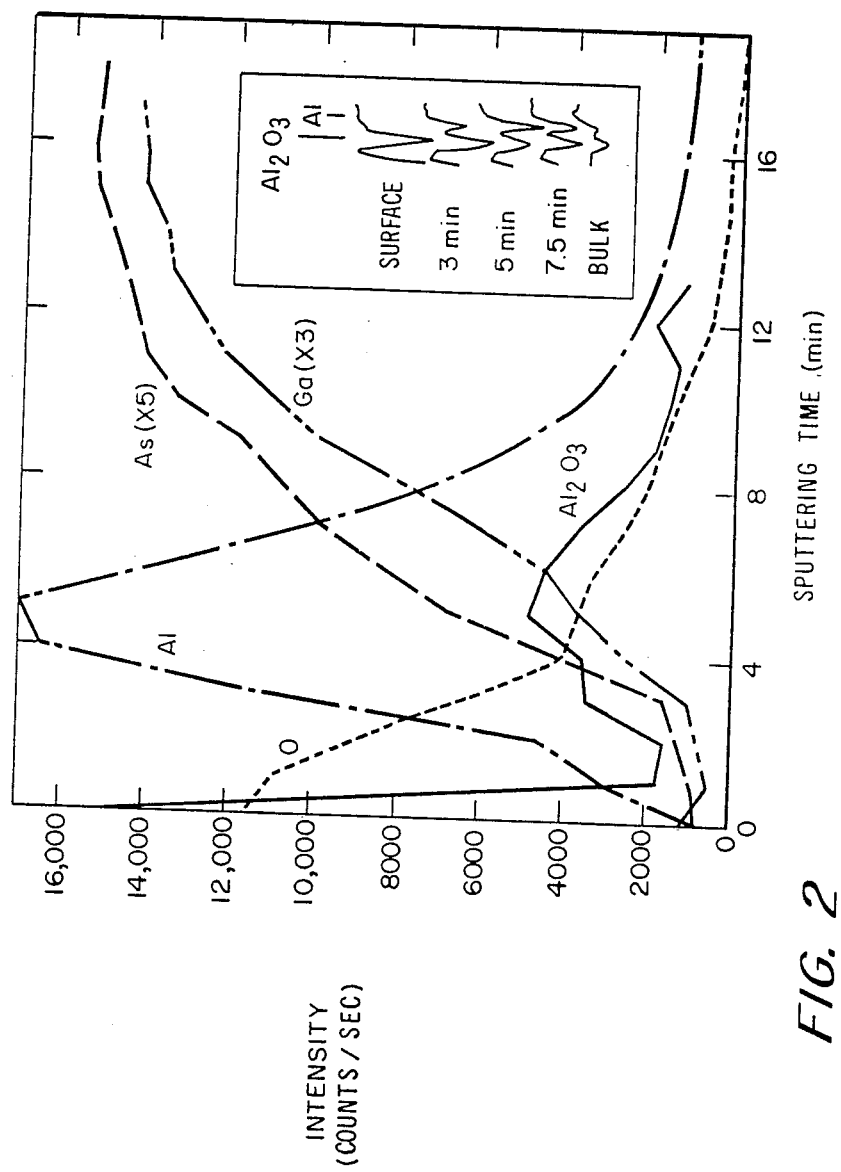
FIG. 2 is a graphic illustration of an auger sputter depth profile at 3 to 4 Å per minute of an air-cleared GaAs<110> crystal with a 50 Å passivating layer of Al.
Figure 3:
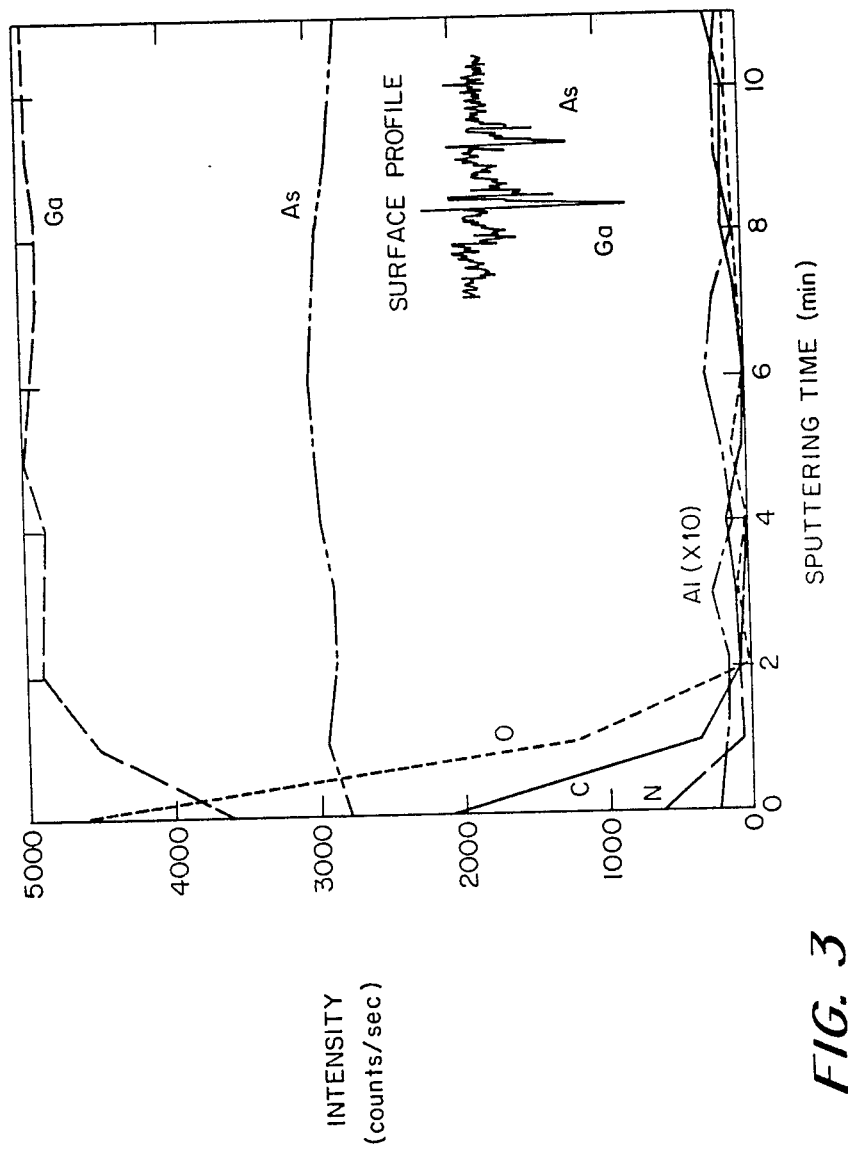
FIG. 3 is a graphic illustration of an auger sputter depth profile at an aircleaved GaAs<110> crystal without any passivating layer.

After removing the samples from the apparatus, an auger spectroscopy depth profile was performed on each of the samples. FIGS. 2 and 3 illustrate data obtained from auger election spectroscopy depth profiles for a GaAs portion/laser facet sample coated respectively with an Al layer 30 and with no layer.

A typical profile for a laser facet GaAs sample at a 3 to 4 Å/min ion profiling rate is illustrated in FIG. 2. The top surface of the sample, i.e., at zero sputtering time, consists mainly of oxidized Al. This is, of course, due to oxidation of the surface of the reactive Al layer 30 upon removal from the vacuum chamber. Next, a high concentration of Al is seen at 12 to 20 Å below the free surface after a sputtering time of 4 to 5 minutes. At about the same distance from the GaAs substrate, a second peak occurs in the $Al_2O_3$ concentration of the overlayer. This peak is produced by oxygen originating on the GaAs facet, because of the measured dip just below the Al surface, i.e., at about 2 minutes sputtering of the Al film. This evolution with sputter time of the line shapes corresponding to these relative intensities of the Al and $Al_2O_3$ low energy LVV auger transitions are shown in the inset of FIG. 2. The $Al_2O_3$ peak indicates that any oxide or water vapor which had been present on the cleaved sample prior to deposition has now been gettered into the reactive Al layer 30.

This cleansing of the laser mirror facet is evident from the oxygen LVV signal and the Ga:As stoichiometry at the interface. In the unprocessed, aircleaved GaAs sample of FIG. 3, the surface exhibits the presence 60% more oxygen than As. The facet below the 50 Å Al overlayer, i.e., at 12 minutes in FIG. 2, the oxygen measurement is less than a third of the As measurement. The thin Al layer has, therefore, reduced the oxygen at the laser facet by at least a factor of five. At the processed facet in FIG. 2, the GaAs is stoichiometric based on the Ga/As ratio of 1.6 at 12 minutes, while at the unprocessed facet in FIG. 3, it is only 1.3 in FIG. 3. The Ga:As LMM ratio has a bulk value of 1.6, as shown by the surface surface profile in the insert of FIG. 3.

The results shown in FIG. 2 are also true relative the GaAlAs sample from the same laser sample.

Figure 4:
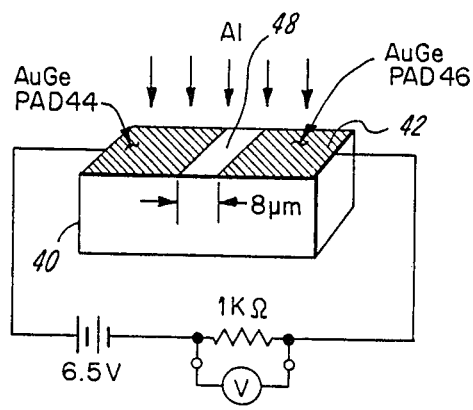
FIG. 4 shows a test sample comprising a GaAs wafer sample with a deposited 50 Å Al film on the sample surface.
Figure 5:
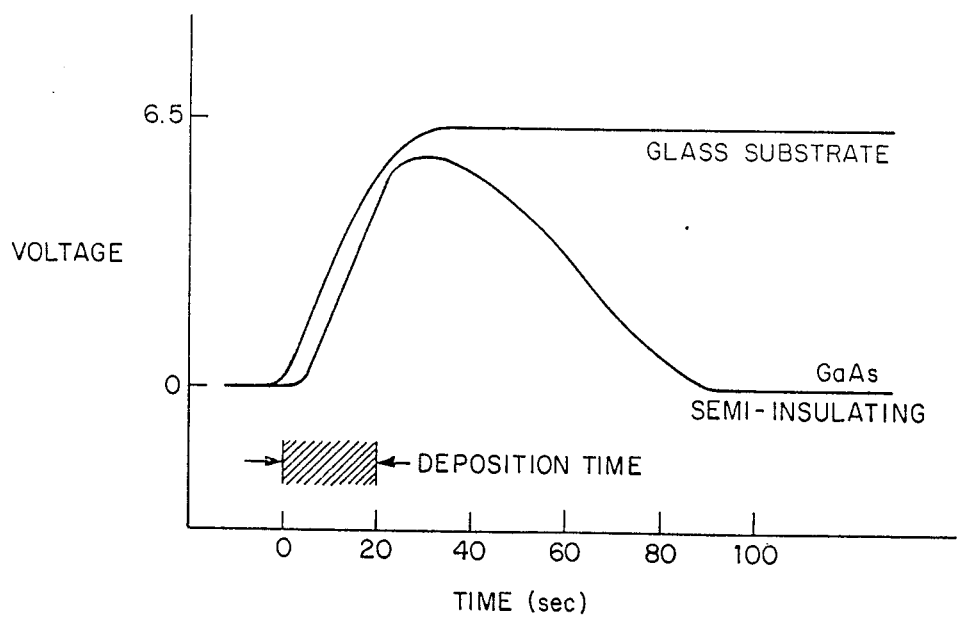
FIG. 5 is a graphic illustration of electrical measurements versus time in monitoring the out diffusion or gettering action of the deposited Al film on the sample shown in FIG. 4.

Another performed test, which shows the gettering action of the Al film or layer 30 on a cleaved GaAs surface, is illustrated in FIGS. 4 and 5. As shown in FIG. 4, a semi-insulating GaAs wafer sample 40 was cleaved in air and AuGe contact pads 44 and 46 were subsequently evaporated on the <110> cleaved face 42. A 8 μm separation between pads was formed by evaporation around a wire shadow mask provided at the face 42. Also, a quartz substrate (not shown) with deposited contact pads 44 and 46 was similarly prepared with a 8 μm separation.

For testing purposes, batteries were applied across the pads 44 and 46 of both samples and the voltage across a 1 KΩ resistor was monitored for each sample. This electrical test circuitry is illustrated in FIG. 5.

Both samples were then placed in the previously described sputtering apparatus. As illustrated in FIG. 5, prior to deposition of an Al film, no voltages were measured due to the nonconducting nature of both the GaAs and quartz substrates. Next, Al was deposited for period 20 seconds, leaving a film 48 approximately 50 Å thick on both samples. As shown in FIG. 5 the current initially began to flow in both samples owing to the fact that the deposited Al film 48 was in contact with and contiguous between AuGe pads. However, the Al film deposited on the GaAs sample obtained an insulating quality within 80 seconds after the completion of its deposition whereas the Al film on the quartz remained conducting for a much longer time period. This indicates that the Al film 48 on the GaAs sample 40 became oxidized due to the gettering of water, oxygen and other contaminants from the sample face 42 between the contact pads 44 and 46.

It will be recalled from the insert in FIG. 2 that thicker films contain Al at a concentration comparable to that of the reacted $Al_2O_3$. Since no electrical conduction is found in the experiments illustrated in FIG. 5, it is believed that the excess Al may exist as metal clusters 36 within the oxide film 30 as theorized in the illustration in FIG. 1.

The thin 20 Å to 50 Å thick Al layers 30 have been applied to the cleaved <110> facets of several GaAs/GaAlAs double heterostructure lasers. Due to the rapid gettering action of these layers, no shunting of the laser current through these coatings has been observed. Subsequently, $Al_2O_3$ half-wave overcoatings or overlayers 32 of about 2000 Å to 2500 Å have been applied. When tested with a Sebastion 1 Adherence Tester, we found that the mirror overcoating 32 has substantially improved adhesion properties if the reactive Al layer 30 first deposited on the facet.

Examples of other chemically reactive films for layer 30 that are within the scope of this invention are Si (either deposited in a hydrogen environment or deposited as a silane compound), Ta, V, Sb, Mn, Cr and Ti.

The gettering action of reactive materials, e.g. Al, is known in the art, as exemplified in the Articles of R. S. Bauer et al, "Au and Al Interface Reactions With $SiO_2$", *Applied Physics Letters,* Vol. 37(11), pp. 1006–1008 (Dec. 1, 1980); S. T. Kowalczyk et al, "Interfacial Chemical Reactivity of Metal Contacts With Thin Native Oxides of GaAs", *Journal of Vacuum Science Technology,* Vol. 19(3), pp. 611–616 (September/October 1981); and G. P. Schwartz et al, "Chemical Reaction at the Al-GaAs Interface", *Journal of Vacuum Science Technology,* Vol. 19(3) pp. 607–610 (September/October 1981) and in the book "Dielectric Films on Gallium Arsenide" by W. F. Croydon and E. H. C. Parker and published in 1981 by Gordon & Beach, Science Publishers, Inc., Section 5.4.4 *Oxidation of Deposited Metal Films* (page 101). While some of these studies suggested deposition of Al films on GaAs surfaces, and forming $Al_2O_3$ film on such surfaces, there was no realization or obtainment of the benefits and advantages that might be achieved if such films were deposited on the facets of semiconductor lasers or the like, taking into consideration the proper control of film thickness as taught herein.

While the invention has been described in conjunction with specific embodiments, it is evident that many alternatives, modifications and variations will be apparent to those skilled in the art in light of the foregoing description. Accordingly, it is intended to embrace all such alternatives, modifications, and variations as fall within the spirit and scope of the appended claims.

What is claimed is:

1. The method of making a facet coating for a semiconductor light emitting device, such as a semiconductor laser or the like, comprising the steps of:

depositing a thin layer of a reactive material selected from the group consisting of Al, Si, Ta, V, Sb, Mn, Cr and Ti on the cleaved facet to getter oxygen and other reactive contaminants therefrom, the thickness of the deposition of said layer characterized to be sufficiently thick to react with an optimum amount of said contaminants but sufficiently thin in order that the reactive material is sufficiently consumed in the gettering process and to render the thin layer electrically nonconductive, if initially conductive in nature, and depositing at least one protective overlayer over said thin layer.

2. The method of making a facet coating for a semiconductor light emitting device, such as a semiconductor laser or the like, comprising the steps of:

depositing a thin layer of a reactive material on the cleaved facet to getter oxygen and other reactive contaminants therefrom, and controlling the thickness of the deposition to be sufficiently thick to react with an optimum amount of said contaminants but sufficiently thin in order that the reactive material is sufficiently consumed in the gettering process to render the thin layer electrically nonconductive if conductive in nature.

said reactive material comprising Al and the thickness of said Al layer is preferably controlled to be within the range of 20 Å to 75 Å.

3. The method of claim 2 including the step of depositing a layer of $Al_2O_3$ on said thin Al layer.

* * * * *